US011519963B2

(12) United States Patent
Ooiso

(10) Patent No.: US 11,519,963 B2
(45) Date of Patent: Dec. 6, 2022

(54) SEMICONDUCTOR INTEGRATED CIRCUIT HAVING SCAN CHAINS SEQUENTIALLY SUPPLIED WITH A CLOCK SIGNAL

(71) Applicant: Kioxia Corporation, Tokyo (JP)

(72) Inventor: Masaki Ooiso, Shinagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/019,668

(22) Filed: Sep. 14, 2020

(65) Prior Publication Data

US 2021/0239759 A1 Aug. 5, 2021

(30) Foreign Application Priority Data

Feb. 5, 2020 (JP) .............................. JP2020-017660

(51) Int. Cl.
  *G01R 31/3185* (2006.01)
  *G01R 31/3177* (2006.01)
  *G01R 31/317* (2006.01)
  *G01R 31/3183* (2006.01)

(52) U.S. Cl.
  CPC . *G01R 31/318536* (2013.01); *G01R 31/3177* (2013.01); *G01R 31/31725* (2013.01); *G01R 31/318321* (2013.01); *G01R 31/318586* (2013.01)

(58) Field of Classification Search
  CPC .... G01R 31/318536; G01R 31/318321; G01R 31/3177; G01R 31/318586; G01R 31/31725
  See application file for complete search history.

(56) References Cited

U.S. PATENT DOCUMENTS

| 8,055,965 | B2 | 11/2011 | Kaneko |
| 8,904,255 | B2 | 12/2014 | Tekumalla et al. |
| 10,234,505 | B1* | 3/2019 | Shivaray .......... G01R 31/31727 |
| (Continued) |

FOREIGN PATENT DOCUMENTS

| JP | 2005-032102 A | 2/2005 |
| JP | 5275136 B2 | 8/2013 |

OTHER PUBLICATIONS

S. Bhunia, H. Mahmoodi, D. Ghosh, S. Mukhopadhyay and K. Roy, "Low-power scan design using first-level supply gating," in IEEE Transactions on Very Large Scale Integration (VLSI) Systems, vol. 13, No. 3, pp. 384-395, Mar. 2005. (Year: 2005).*

(Continued)

*Primary Examiner* — Cynthia Britt
(74) *Attorney, Agent, or Firm* — Oblon, McClelland, Maier & Neustadt, L.L.P.

(57) ABSTRACT

A semiconductor integrated circuit includes scan chains, each of which includes a serial connection of sequential circuits and performs a shift register operation in a scan test; and an integrated clock gating (ICG) chain composed by coupling, to one another, ICG circuits, each of which individually supplies a corresponding one of the scan chains with a circuit clock signal to operate the sequential circuits. In the ICG chain, an ICG enable propagation signal for controlling timing when the ICG circuits output the circuit clock signals propagates through a signal line and is input sequentially to the ICG circuits. The ICG circuits output the circuit clock signals at respective timings that are different among the scan chains.

19 Claims, 13 Drawing Sheets

(56) References Cited

U.S. PATENT DOCUMENTS

| | | | |
|---|---|---|---|
| 2002/0112199 A1* | 8/2002 | Whetsel | G01R 31/318536 714/30 |
| 2006/0282727 A1 | 12/2006 | Hoshaku | |
| 2008/0086666 A1* | 4/2008 | Kawamura | G01R 31/318544 714/729 |
| 2009/0240996 A1* | 9/2009 | Sasaya | G01R 31/318594 714/729 |
| 2009/0240997 A1* | 9/2009 | Hasegawa | G01R 31/31727 714/E11.155 |
| 2017/0115342 A1* | 4/2017 | Wang | G11C 16/0483 |
| 2019/0154757 A1* | 5/2019 | Lujan | G01R 31/318552 |
| 2021/0063489 A1* | 3/2021 | Watanabe | G01R 31/318552 |

OTHER PUBLICATIONS

L. Whetsel, "Adapting scan architectures for low power operation," Proceedings International Test Conference 2000 (IEEE Cat. No. 00CH37159), Atlantic City, NJ, USA, 2000, pp. 863-872. (Year: 2000).*

* cited by examiner

SEMICONDUCTOR INTEGRATED CIRCUIT HAVING SCAN CHAINS SEQUENTIALLY SUPPLIED WITH A CLOCK SIGNAL

CROSS REFERENCE TO RELATED APPLICATIONS

This application is based upon and claims the benefit of priority from prior Japanese Patent Application P2020-017660 filed on Feb. 5, 2020; the entire contents of which are incorporated by reference herein.

FIELD

Embodiments described herein relate generally to a semiconductor integrated circuit in which a scan chain is configured.

BACKGROUND

A scan test is used for facilitating a test of a semiconductor integrated circuit. The scan test is executed by connecting sequential circuits such as flip-flops in a semiconductor integrated circuit in series to one another and configuring a scan chain as a shift register inside a clock domain. In the scan test, a test pattern is input from a scan-in terminal of the scan chain to control operations of the sequential circuits, and data held by the sequential circuits are observed by a scan-out terminal thereof.

In order to suppress a power consumption of the semiconductor integrated circuit, a clock gating technology is used, which supplies a clock signal to circuits by using an integrated clock gating (ICG) circuit, the circuit requiring the clock signal. However, in the scan test, all the sequential circuits as targets of the scan test, which are included in the semiconductor integrated circuit, operate simultaneously in synchronization with the clock signal. Therefore, in the scan test, a large power consumption is instantaneously generated in the semiconductor integrated circuit.

DETAILED DESCRIPTION

Figure 1:
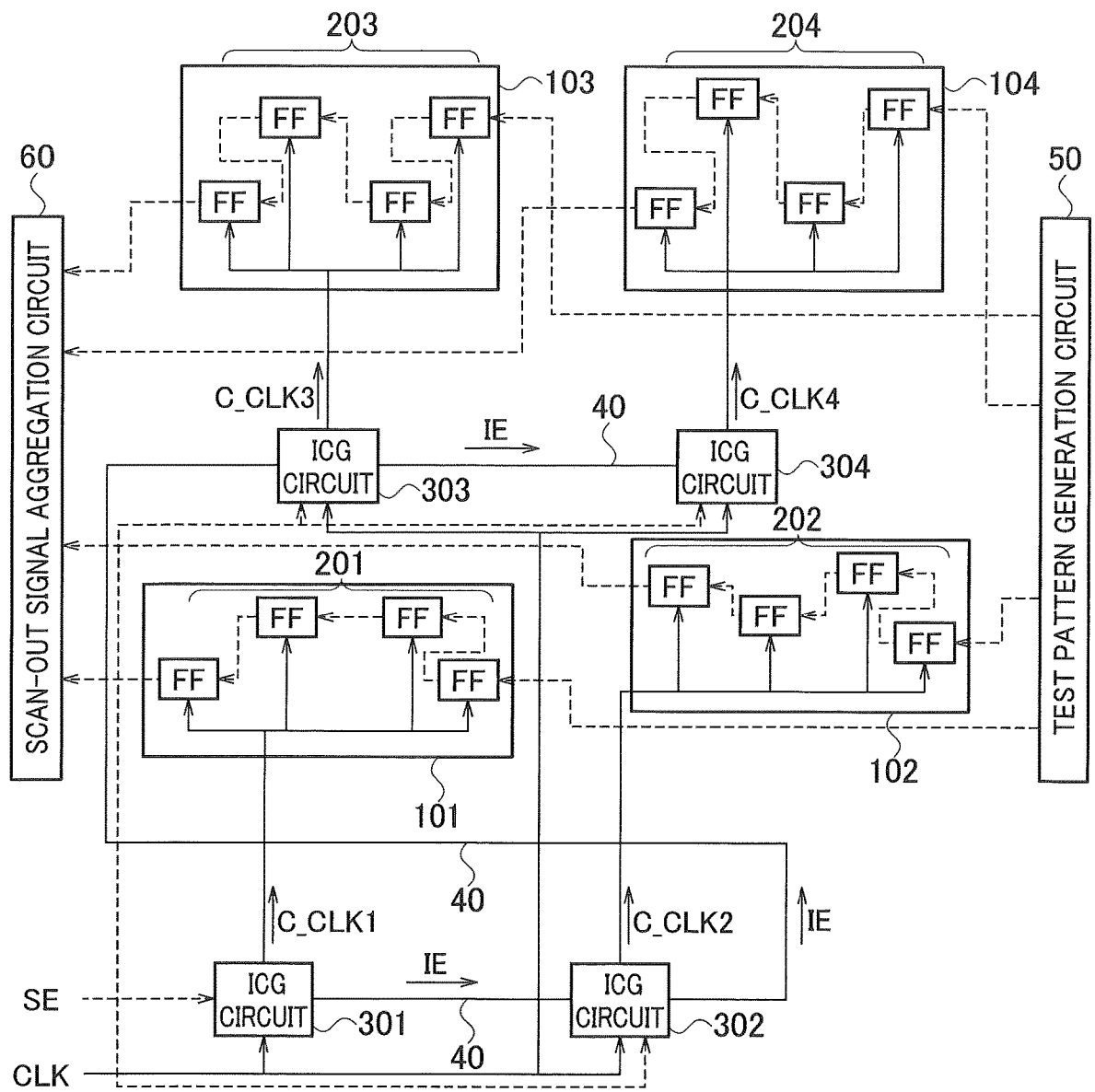
FIG. 1 is a circuit diagram illustrating a configuration of a semiconductor integrated circuit according to a first embodiment.

A semiconductor integrated circuit according to embodiments includes: a plurality of scan chains each of which includes a serial connection of sequential circuits and performs a shift register operation; and an ICG chain including a plurality of ICG circuits each of which individually supplies any of the scan chains with a circuit clock signal for operating the sequential circuits. The ICG chain is coupled by a signal line, and an ICG enable propagation signal that propagates through the signal line is input sequentially to the ICG circuits. In response to the input of the ICG enable propagation signal, the ICG circuits supply the scan chains with the circuit clock signals.

Hereinafter, a description will be given of the embodiments with reference to the drawings. In the description of the drawings, the same reference numerals are assigned to the same portions, and a description thereof is omitted.

First Embodiment

As illustrated in FIG. 1, a semiconductor integrated circuit according to a first embodiment includes scan chains 201 to 204 each of which includes a serial connection of a plurality of sequential circuits. The scan chains 201 to 204 are connected in parallel to one another between a test pattern generation circuit 50 and a scan-out signal aggregation circuit 60. Hereinafter, the scan chains 201 to 204 will also be collectively referred to as "scan chains 20".

In FIG. 1, a case of using flip-flops (FFs) as the sequential circuits is illustrated as an example. Note that, though a case where the number of FFs included in each of the scan chains 20 is four is illustrated in FIG. 1, the number of FFs included in the scan chain 20 is arbitrary. Moreover, the number of FFs may differ between the scan chains 20.

In order to execute a scan test of the semiconductor integrated circuit, the scan chains 20 are composed as shift registers in each of which the FFs are coupled to one another. In the scan test, scan-in, capture, and scan-out are executed. The test pattern generation circuit 50 generates a test pattern in the scan-in. The scan-out signal aggregation circuit 60 outputs a result of the scan test in the scan-out.

Hereinafter, shift register operations of the scan chains 20 in the scan test will also be referred to as "scan shift operations". Meanwhile, operations other than the scan shift operations in the scan test of the semiconductor integrated circuit will also be referred to as "scan capture operations".

Note that the scan chains 201 to 204 are scan chains included in circuit blocks 101 to 104, respectively. Hereinafter, the circuit blocks 101 to 104 will also be collectively referred to as "circuit blocks 10".

In the semiconductor integrated circuit illustrated in FIG. 1, a clock gating technology is applied, in which a clock signal (hereinafter, referred to as "system clock signal CLK") that controls the operations of the semiconductor integrated circuit is input to the circuit blocks 10 via the ICG circuits 301 to 304. That is, in normal operations of the semiconductor integrated circuit, the ICG circuits 301 to 304 control supply of the system clock signal CLK for each of the circuit blocks 10. Thus, the circuit blocks 10 are supplied with the system clock signal CLK at required timing, and a power consumption of the semiconductor integrated circuit can be suppressed.

Hereinafter, the ICG circuits 301 to 304 will be collectively referred to as "ICG circuits 30". Moreover, a plurality of the system clock signals CLK output via the ICG circuits 30 to the circuit blocks 10 will also be referred to as "circuit clock signals C_CLK". That is, a circuit clock signal C_CLK1 is output from the ICG circuit 301 to the circuit block 101. A circuit clock signal C_CLK2 is output from the ICG circuit 302 to the circuit block 102. A circuit clock signal C_CLK3 is output from the ICG circuit 303 to the circuit block 103. Then, a circuit clock signal C_CLK4 is output from the ICG circuit 304 to the circuit block 104.

In the semiconductor integrated circuit illustrated in FIG. 1, the ICG circuits 301 to 304 are coupled to one another by signal lines 40, and an ICG chain is configured. Each of the ICG circuits 301 to 304 individually supplies any of the scan chains 201 to 204 with the circuit clock signal C_CLK for operating the FFs included in the scan chains 20.

In the ICG chain in which the plurality of ICD circuits are coupled to one another, an ICG enable propagation signal IE that propagates through the signal line 40 is input sequentially to the ICG circuits 30. In response to the input of the ICG enable propagation signal IE, the ICG circuits 30 supply the scan chains 20 with the circuit clock signals C_CLK. In the semiconductor integrated circuit illustrated in FIG. 1, the ICG enable propagation signal IE is input sequentially to the ICG circuit 301, the ICG circuit 302, the ICG circuit 303, and the ICG circuit 304. Due to a propagation delay of the ICG enable propagation signal IE when the ICG enable propagation signal IE propagates through the signal line 40 (hereinafter, this propagation delay will be referred to as "wiring delay"), each of the ICG circuits 301 to 304 outputs the circuit clock signal C_CLK at timing different between the scan chains 201 to 204. That is, the circuit clock signals C_CLK are input sequentially to the ICG circuit 301, the ICG circuit 302, the ICG circuit 303, and the ICG circuit 304. In an order of receiving the ICG enable propagation signal IE, the ICG circuits 30 output the circuit clock signals C_CLK.

The timing when each of the ICG circuits 30 outputs the circuit clock signal C_CLK is set by using the ICG enable propagation signal IF, output from a previous-stage ICG circuit 30 between two ICG circuits 30 included in the ICG chain, and using the system clock signal CLK. Specifically, timing when a latter-stage ICG circuit 30 between the two ICG circuits 30 included in the ICG chain outputs the circuit clock signal C_CLK is set after a certain time elapses after the previous-stage ICG circuit outputs the circuit clock signal C_CLK. As described above, the timing when the circuit clock signal C_CLK is output differs between the ICG circuits 301 to 304.

Figure 2:
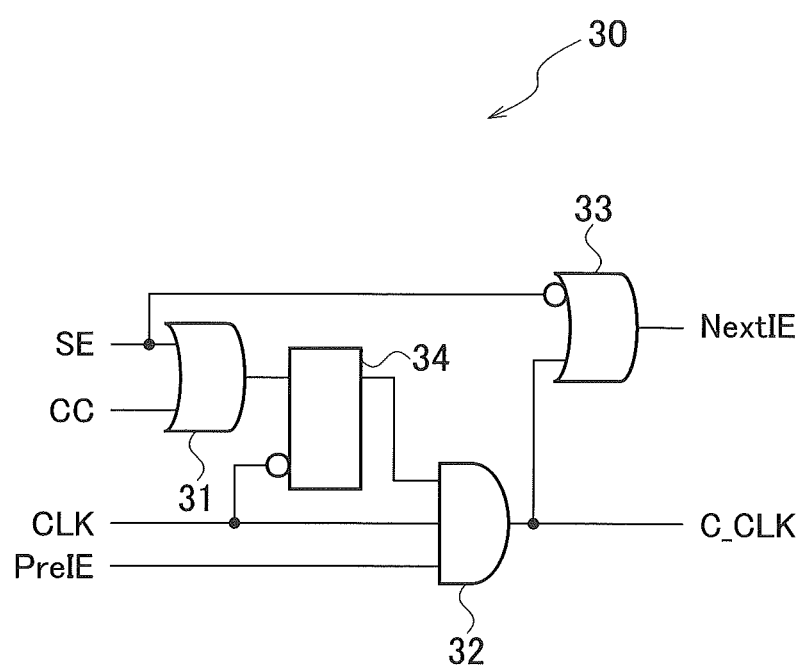
FIG. 2 is a schematic diagram illustrating a configuration of an ICG circuit.

FIG. 2 illustrates an example of the ICG circuit 30. To the ICG circuit 30 illustrated in FIG. 2, there are input: a clock gate control signal CC of the system; a scan shift enable signal SE; the system clock signal CLK; and the ICG enable propagation signal IE (indicated as "signal PreIE" in FIG. 2) propagated from the previous-stage ICG circuit 30. Then, the ICG circuit 30 outputs the circuit clock signal C_CLK and the ICG enable propagation signal IE (indicated as "signal NextIE" in FIG. 2), that is propagated to the next-stage ICG circuit 30.

The clock gate control signal CC is a control signal of the system, which is for use in the clock gating technology for controlling the supply of the system clock signal CLK for each of the circuit blocks 10. The scan shift enable signal SE is a signal for controlling write of data of the FFs, and the scan shift enable signal SE is input to all the FFs as targets of the scan test, the FFs being included in the semiconductor integrated circuit. In the scan shift operation, the scan shift enable signal SE has an enable value, and in a scan capture operation, the scan shift enable signal SE has a disable value. When the scan shift enable signal SE is an enable signal, the ICG enable propagation signal IE propagates through the ICG chain. Hereinafter, the enable value will be "1", and the disable value will be "0".

The ICG circuit 30 illustrated in FIG. 2 includes a first combinational circuit 31, a second combinational circuit 32, a third combinational circuit 33, and an ICG sequential circuit 34.

The first combinational circuit 31 outputs a logical sum of the clock gate control signal CC and the scan shift enable signal SE. The ICG sequential circuit 34 captures an output of the first combinational circuit 31 at an off-state time of the system clock signal CLK. A latch circuit or the like is used for the ICG sequential circuit 34.

When a stored value of the ICG sequential circuit 34 is an enable signal, the second combinational circuit 32 outputs, as the circuit clock signal C_CLK, a logical product of the ICG enable propagation signal IE (signal PreIE) output by the previous-stage ICG circuit 30 in the ICG chain and of the system clock signal CLK.

When the scan shift enable signal SE is a disable signal, the third combinational circuit 33 outputs an enable signal as the ICG enable propagation signal IE (signal NextIE). Meanwhile, when the scan shift enable signal SE is an enable signal, the third combinational circuit 33 outputs the circuit clock signal C_CLK as the ICG enable propagation signal IE (signal NextIE). The ICG enable propagation signal IE (signal NextIE) output by the third combinational circuit 33 is input to the next-stage ICG circuit 30 in the ICG chain.

In the normal operations other than the scan test, the clock gate control signal CC is stored in the ICG sequential circuit 34 in a state in which the scan shift enable signal SE is a disable signal and the ICG enable propagation signal IE is an enable signal. At this time, when the stored value of the ICG sequential circuit 34 is an enable signal, the ICG circuit 30 outputs the system clock signal CLK as the circuit clock signal C_CLK. Meanwhile, when the stored value of the ICG sequential circuit 34 is a disable signal, the ICG circuit 30 outputs an off-state value as the circuit clock signal C_CLK, and outputs an enable signal as the ICG enable propagation signal IE.

In the scan test, an enable signal is stored in the ICG sequential circuit 34 in a state in which the scan shift enable signal SE is such an enable signal. At this time, the ICG circuit 30 outputs the logical product of the system clock signal CLK and the ICG enable propagation signal IE (signal PreIE) as the circuit clock signal C_CLK and the ICG enable propagation signal IE (signal NextIE).

As described above, the ICG circuit 30 illustrated in FIG. 2 uses the ICG circuit for applying the clock gating technology to the semiconductor integrated circuit. Therefore, the number of circuit elements for achieving the ICC chain and an area of the semiconductor integrated circuit can be suppressed from increasing.

Figure 3:
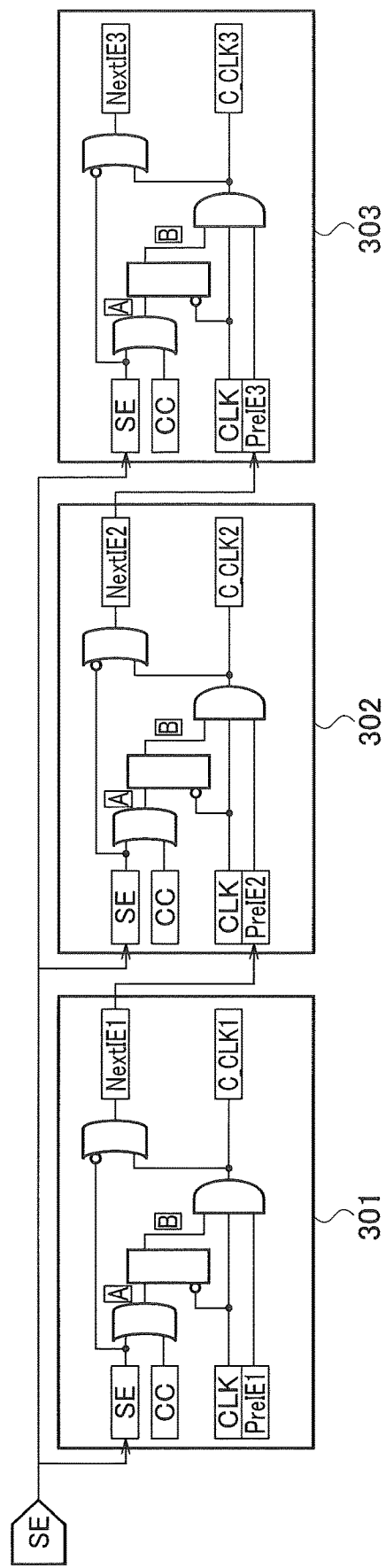
FIG. 3 is a circuit diagram illustrating a configuration of an ICG chain using a plurality of the ICG circuits each of which is illustrated in FIG. 2.

FIG. 3 illustrates an ICG chain using the ICC circuits 30 illustrated in FIG. 2. FIG. 3 illustrates, as an example, an ICG chain in which three ICG circuits 301 to 303 are coupled to one another. The ICC circuits 301 to 303 supply the circuit clock signals C_CLK to the scan chains 20 of the circuit blocks 101 to 103, respectively.

The clock gate control signal CC of the system, the scan shift enable signal SE, and the system clock signal CLK are input to all the ICG circuits 301 to 303. Meanwhile, the ICG enable propagation signal IE propagates from the ICG circuit 301 via the ICG circuit 302 to the ICG circuit 303. That is, a signal NextIE1 output from the ICG circuit 301 is input as a signal PreIE2 to the ICG circuit 302. Then, the signal NextIE2 output from the ICG circuit 302 is input as a signal PreIE3 to the ICG circuit 303. The ICG circuit 303 output a signal NextIE3. Note that, to the first-stage ICG circuit 301 in the ICG chain, a fixed value "1" is input as the signal PreIE1.

In the ICG chain, a wiring delay of the ICG enable propagation signal IE occurs between the ICG circuits 30. Therefore, timing when each circuit clock signal C_CLK is output differs between the ICG circuits 30 which configure the ICG chain. As a result, such circuit clock signals C_CLK are input to the circuit blocks 101 to 103 while having time differences therebetween. Thus, differences in the timing when the FFs operate occur between the scan chains 20.

Hence, it is only the FFs included in one scan chain that operate simultaneously in the scan test of the semiconductor integrated circuit. As a result, an instantaneous power consumption in the scan test can be suppressed.

Figure 4:
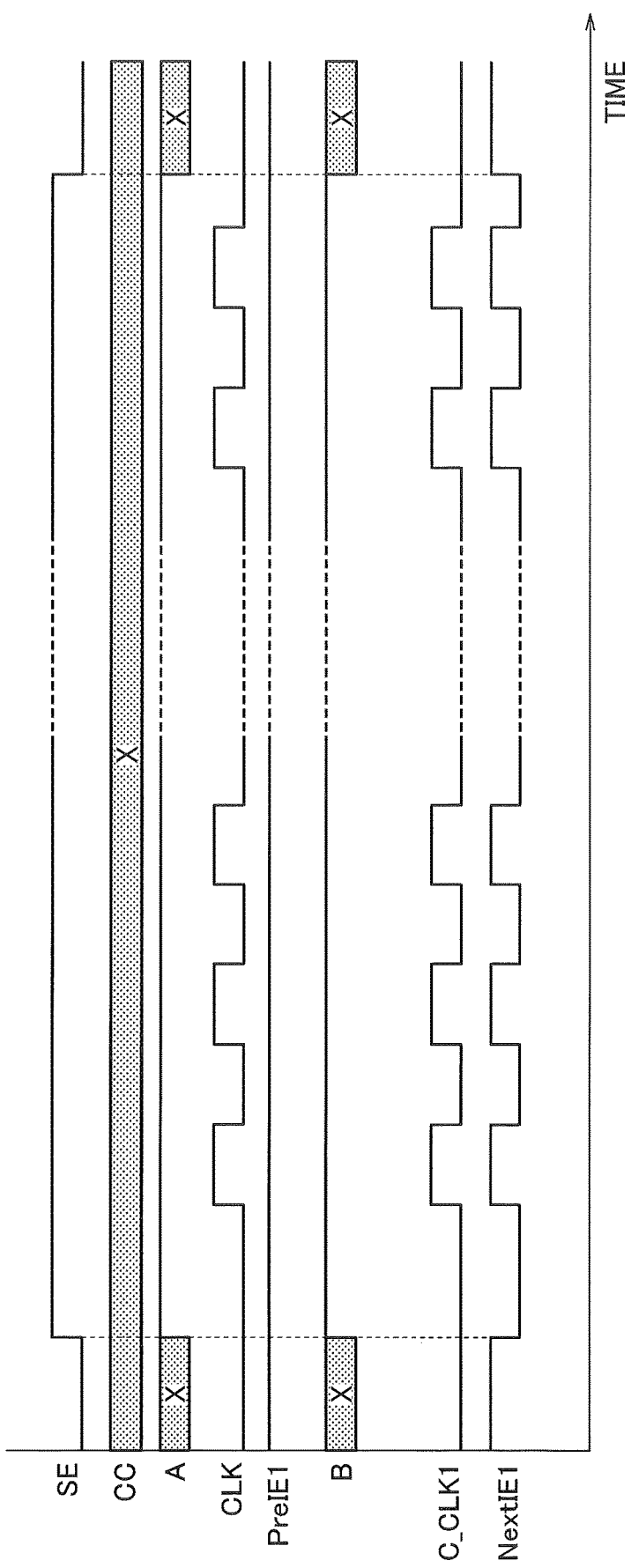
FIG. 4 is a timing chart illustrating operations of the ICG circuit at a first stage of the ICG chain.
Figure 5:
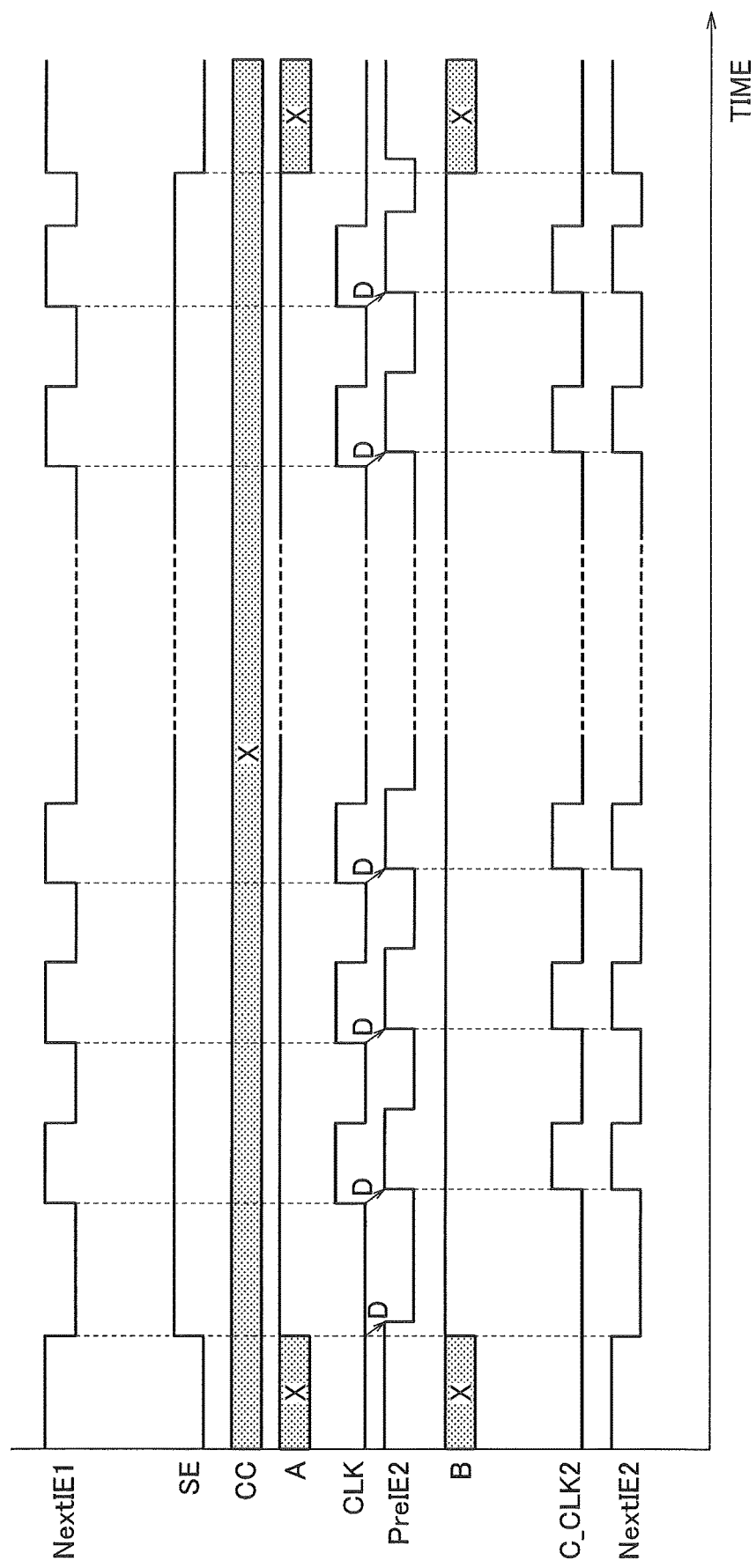
FIG. 5 is a timing chart illustrating operations of the ICG circuit at a second stage of the ICG chain.
Figure 6:
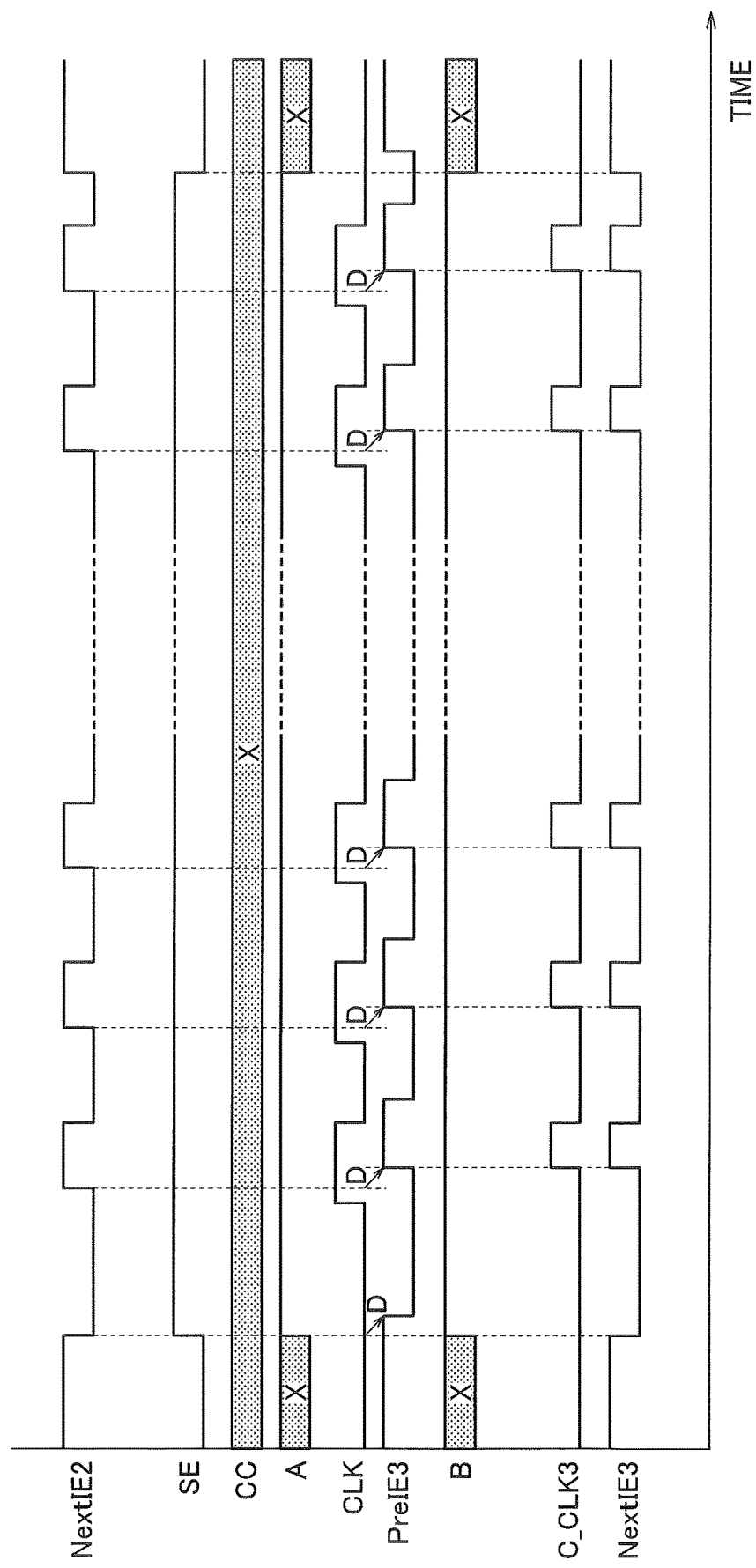
FIG. 6 is a timing chart illustrating operations of the ICG circuit at a third stage of the ICG chain.

FIG. 4 illustrates a timing chart explaining operations of the first-stage ICG circuit 301 in the ICG chain illustrated in FIG. 3. Moreover, FIG. 5 illustrates a timing chart explaining operations of the second-stage ICG circuit 302 in the ICG chain. FIG. 6 illustrates a timing chart explaining operations of the third-stage ICG circuit 303 in the ICG chain. As illustrated in FIG. 4 to FIG. 6, the scan shift enable signal SE has an enable value during a period of the scan shift operation of the scan test. Note that, in FIG. 4 to FIG. 6, a signal A is an output signal of the first combinational circuit 31, and a signal B is an output signal of the ICG sequential circuit 34.

The circuit clock signal C_CLK is a logical product of the system clock signal CLK, the signal PreIE and the output signal of the ICG sequential circuit 34. In the ICG circuit 301, at the time of the scan shift operation of the scan test, the signal PreIE1 and the output signal of the ICG sequential circuit 34 are always "1". Therefore, as illustrated in FIG. 4, in the ICG circuit 301, rising timing of the system clock signal CLK and rising timing of the circuit clock signal C_CLK1 propagated from the ICG circuit 301 to the circuit block 101 coincide with each other.

The signal NextIE1 that is the ICG enable propagation signal TIE output from the ICG circuit 301 propagates through the ICG chain and is input as the signal PreIE2 to the ICG circuit 302. Thus, the circuit clock signal C_CLK2 is output from the ICG circuit 302 to the circuit block 102. Due to the wiring delay in the signal line 40, as illustrated in FIG. 5, the signal PreIE2 input to the ICG circuit 302 is delayed with respect to the signal NextIE1 output by the ICG circuit 301. In FIG. 5, delays caused by the wiring delay of the ICG enable propagation signal IE are indicated by arrows D (the same applies to the following). Since the input of the signal PreIE2 is delayed in the second combinational circuit 32, on-periods of the circuit clock signal C_CLK2 are shortened.

The signal NextIE2 that is the ICG enable propagation signal IE output from the ICG circuit 302 propagates through the ICG chain and is input as the signal PreIE3 to the ICG circuit 303. Thus, the circuit clock signal C_CLK3 is output from the ICG circuit 303 to the circuit block 103. Due to the wiring delay in the signal line 40, as illustrated in FIG. 6, the signal PreIE3 input to the ICG circuit 303 is delayed with respect to the signal NextIE2 output by the ICG circuit 302. Since the input of the signal PreIE3 is delayed in the third combinational circuit 33, on-periods of the circuit clock signal C_CLK3 are shortened more than the on-periods of the circuit clock signal C_CLK2.

As described above, the on-periods of the circuit clock signals C_CLK are shorter in the ICG circuits 30 to which the ICG enable propagation signal IE is input later among the plurality of ICG circuits 30 included in the ICG chain.

Figure 7:
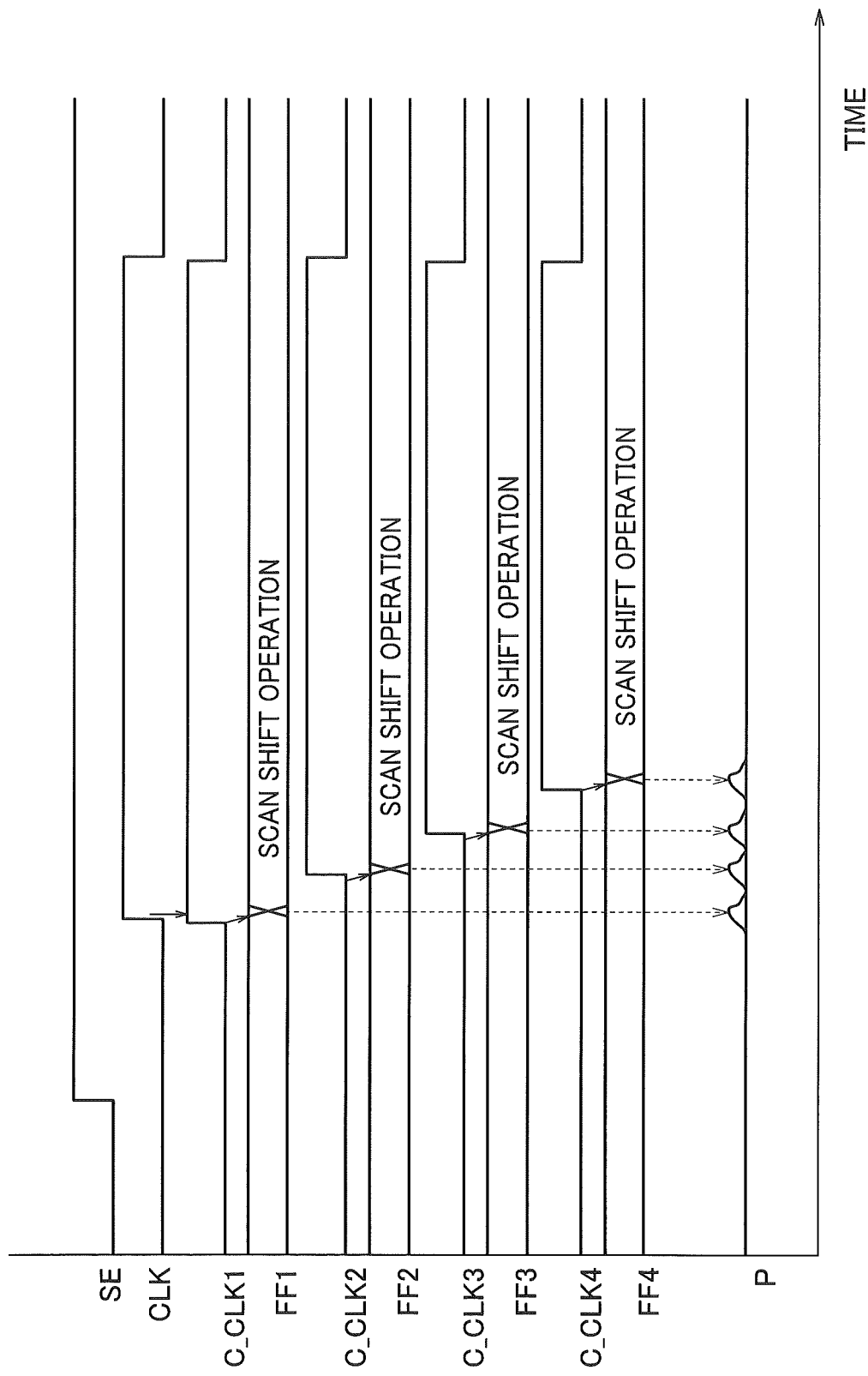
FIG. 7 is a timing chart illustrating operations of the semiconductor integrated circuit according to the first embodiment.

FIG. 7 illustrates a timing chart of the semiconductor integrated circuit illustrated in FIG. 1. In FIG. 7, reference symbols FF1, FF2, FF3 and FF4 denote the scan shift operations of the FFs included in the circuit block 101, the circuit block 102, the circuit block 103, and the circuit block 104, respectively, and power P is power consumed by the semiconductor integrated circuit. As illustrated in FIG. 7, the circuit clock signals C_CLK1 to C_CLK4 are supplied sequentially to the circuit blocks 101 to 104 while having time differences therebetween. The FFs included in the circuit blocks 10 are supplied with the circuit clock signals C_CLK and perform the scan shift operations. Therefore, in the scan test, timing when the power P is consumed in the semiconductor integrated circuit differs between the circuit blocks 101 to 104.

Figure 8:
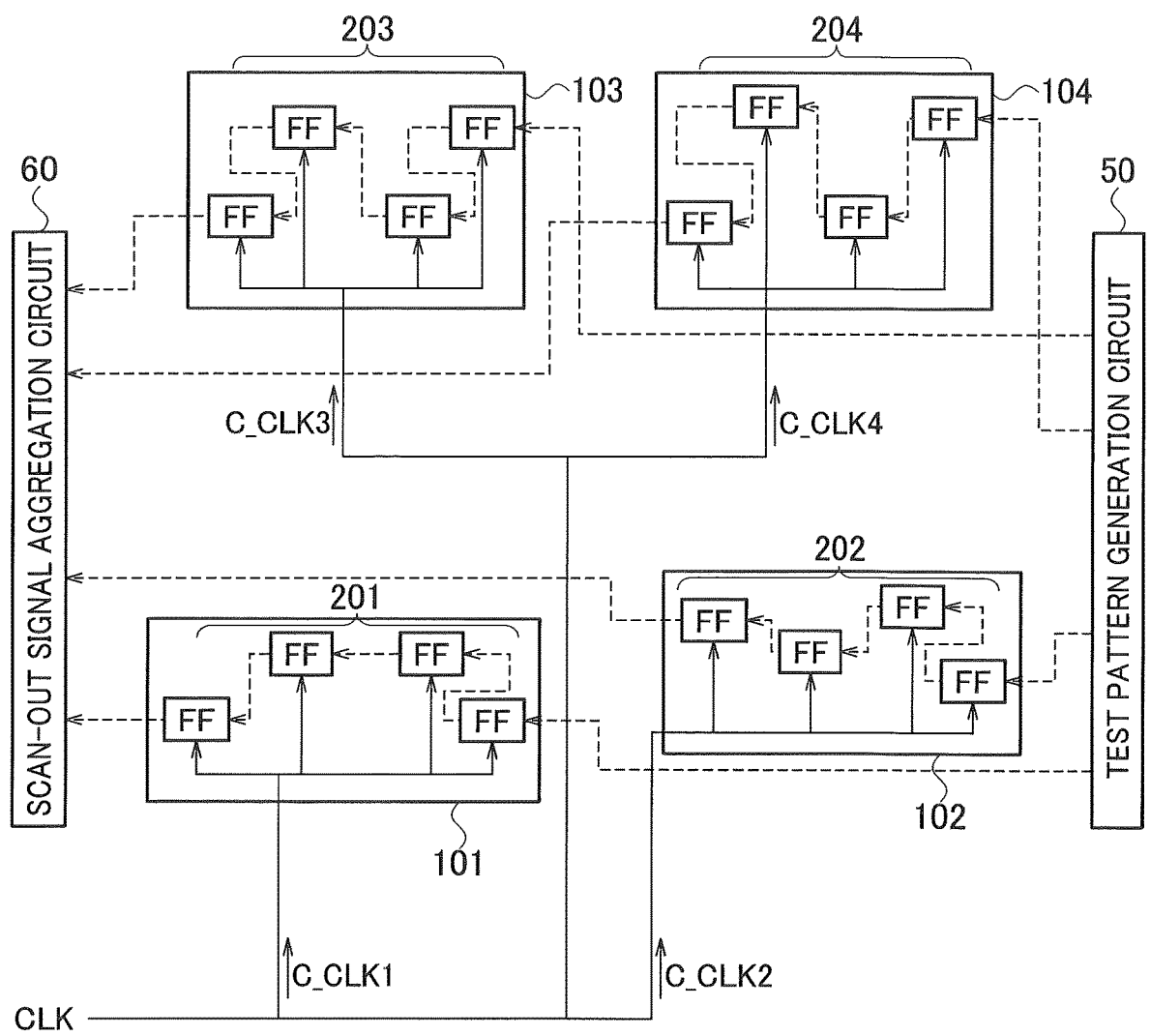
FIG. 8 is a circuit diagram illustrating a configuration of a semiconductor integrated circuit of a comparative example.

FIG. 8 illustrates an example of a semiconductor integrated circuit of a comparative example in which the ICG chain is not configured. The semiconductor integrated circuit of the comparative example, which is illustrated in FIG. 8, includes the circuit blocks 101 to 104. The scan chains 201 to 204 are included in the circuit blocks 101 to 104, respectively. In the semiconductor integrated circuit of the comparative example, in the scan test, the system clock signal CLK is supplied as the circuit clock signals C_CLK1 to C_CLK4 to the circuit blocks 101 to 104.

Figure 9:
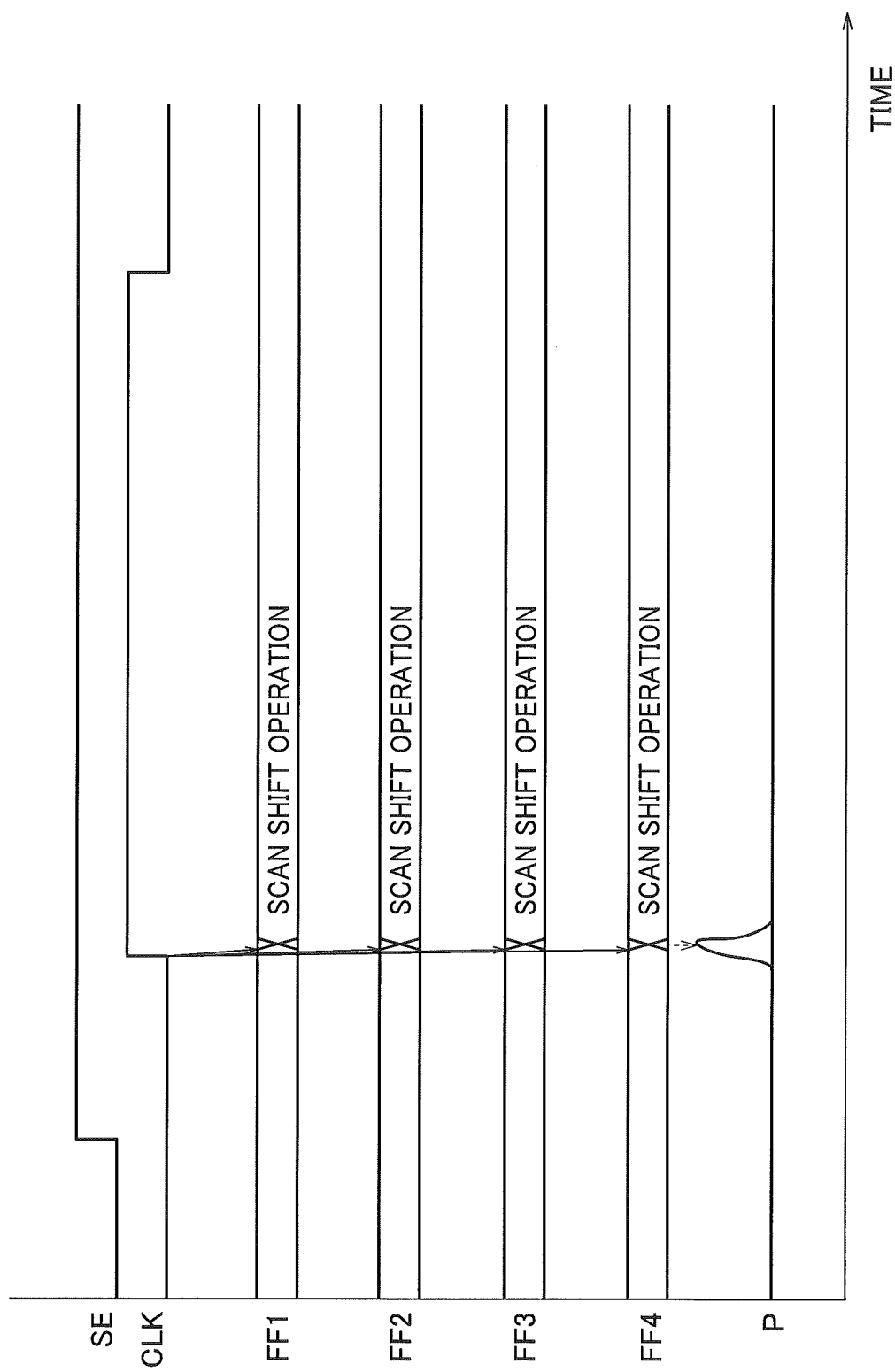
FIG. 9 is a timing chart illustrating operations of the semiconductor integrated circuit of the comparative example.

FIG. 9 illustrates a timing chart of the semiconductor integrated circuit illustrated in FIG. 8. As illustrated in FIG. 9, in the semiconductor integrated circuit of the comparative example, the circuit clock signals C_CLK1 to C_CLK4 are simultaneously supplied to the circuit blocks 101 to 104. Therefore, in the scan test, pieces of the timing when the power P is consumed overlap one another in the circuit blocks 101 to 104, and in some cases, a large power consumption occurs instantaneously.

In contrast to the semiconductor integrated circuit of the comparative example, in the semiconductor integrated circuit illustrated in FIG. 1, the ICG chain is configured, whereby the circuit clock signals C_CLK are supplied to the circuit blocks 10 while having time differences therebetween. Therefore, the number of FFs which operate simultaneously can be suppressed. Hence, in accordance with the semiconductor integrated circuit illustrated in FIG. 1, the instantaneous power consumption in the scan test can be suppressed from increasing.

Note that, preferably, the ICG circuit 30 is composed of one cell in such a case where the semiconductor integrated circuit is fabricated according to the standard cell system. Thus, a cell area can be suppressed in comparison with the case of configuring the ICG circuit 30 by combining a sequential circuit cell, a combinational circuit cell and the like with one another.

First Modified Example

Figure 10:
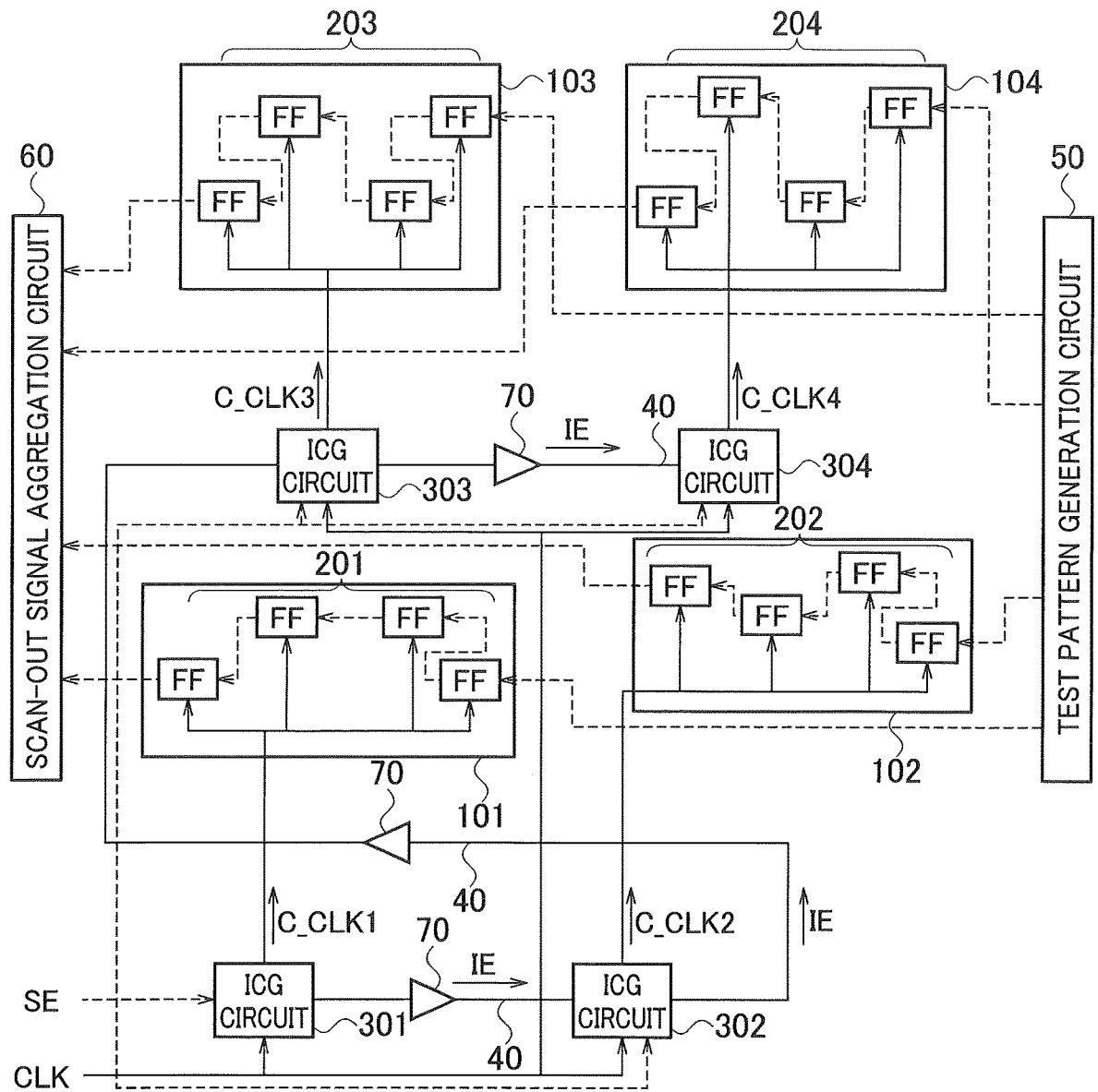
FIG. 10 is a circuit diagram illustrating a configuration of a semiconductor integrated circuit according to a first modified example of the first embodiment.

A semiconductor integrated circuit according to a first modified example of the first embodiment, which is illustrated in FIG. 10, has a configuration in which signal delay circuits 70 which lengthen a propagation time of the ICG enable propagation signal IE are inserted between the ICG circuits 30 which configure the ICG chain. For each of the signal delay circuits 70, for example, such a configuration in which a buffer circuit or two inverters are coupled to one another is adoptable.

In accordance with the semiconductor integrated circuit illustrated in FIG. 10, the delay time of the ICG enable propagation signal IE in the ICG chain can be lengthened more than in the case of only the wiring delay caused by the signal line 40. Thus, the simultaneous operations of the FFs can be suppressed more surely.

Figure 11:
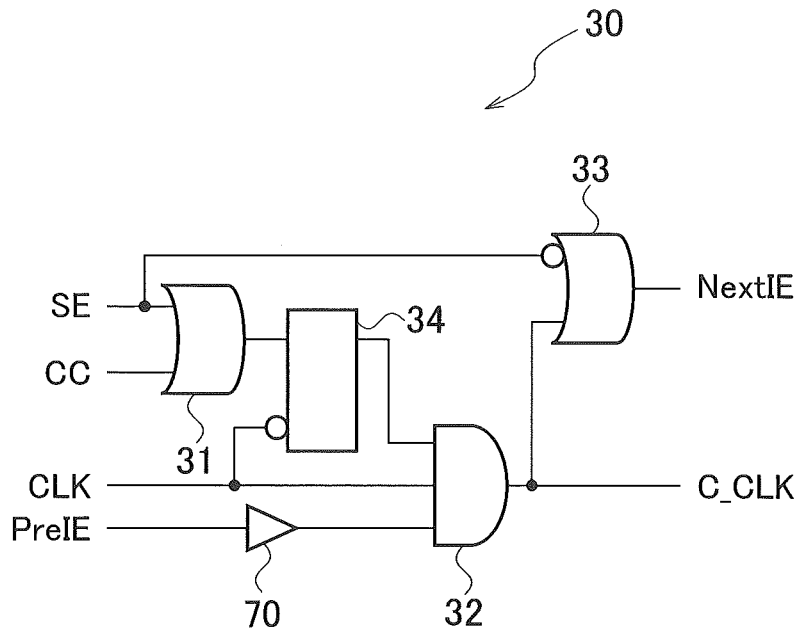
FIG. 11 is a circuit diagram illustrating a configuration of an ICG circuit of the semiconductor integrated circuit according to the first modified example of the first embodiment.
Figure 12:
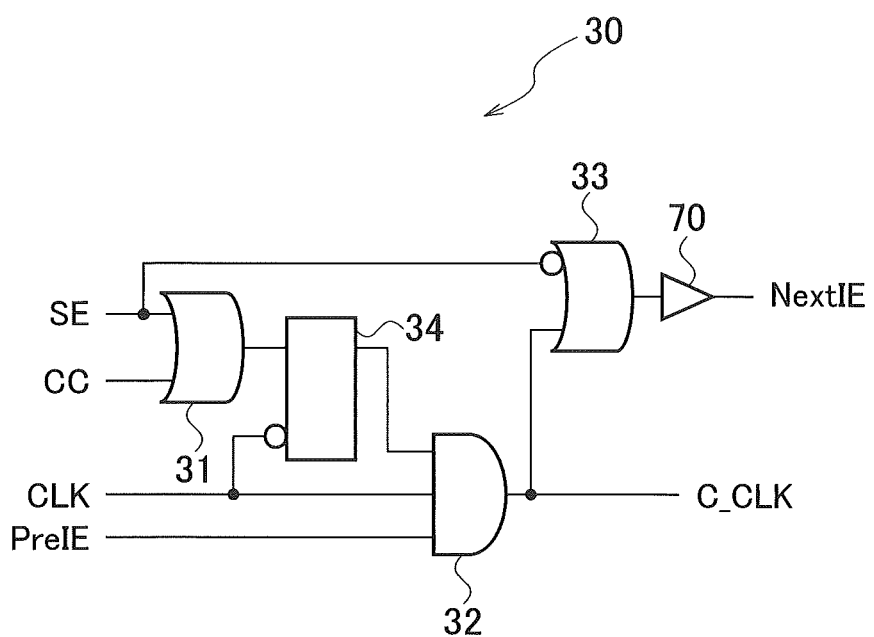
FIG. 12 is a circuit diagram illustrating another configuration of the ICG circuit of the semiconductor integrated circuit according to the first modified example of the first embodiment.

As illustrated in FIG. 10, the signal delay circuit 70 may be disposed in the middle of the signal line 40. Alternatively, as illustrated in FIG. 11, the signal delay circuit 70 may be connected to a terminal of the ICG circuit to which the signal PreIE is input as the ICG enable propagation signal IE. Alternatively, as illustrated in FIG. 12, the signal delay circuit 70 may be connected to a terminal of the ICG circuit 30 from which the signal NextIE is output as the ICG enable propagation signal IE. Alternatively, each of the signal delay circuits 70 may be connected to both of the terminal to which the signal PreIE is input and the terminal from which the signal NextIE is output. For example, in the case of configuring each of the ICG circuits 30 by one cell, the signal delay circuit 70 is included in this cell.

Second Modified Example

Figure 13:
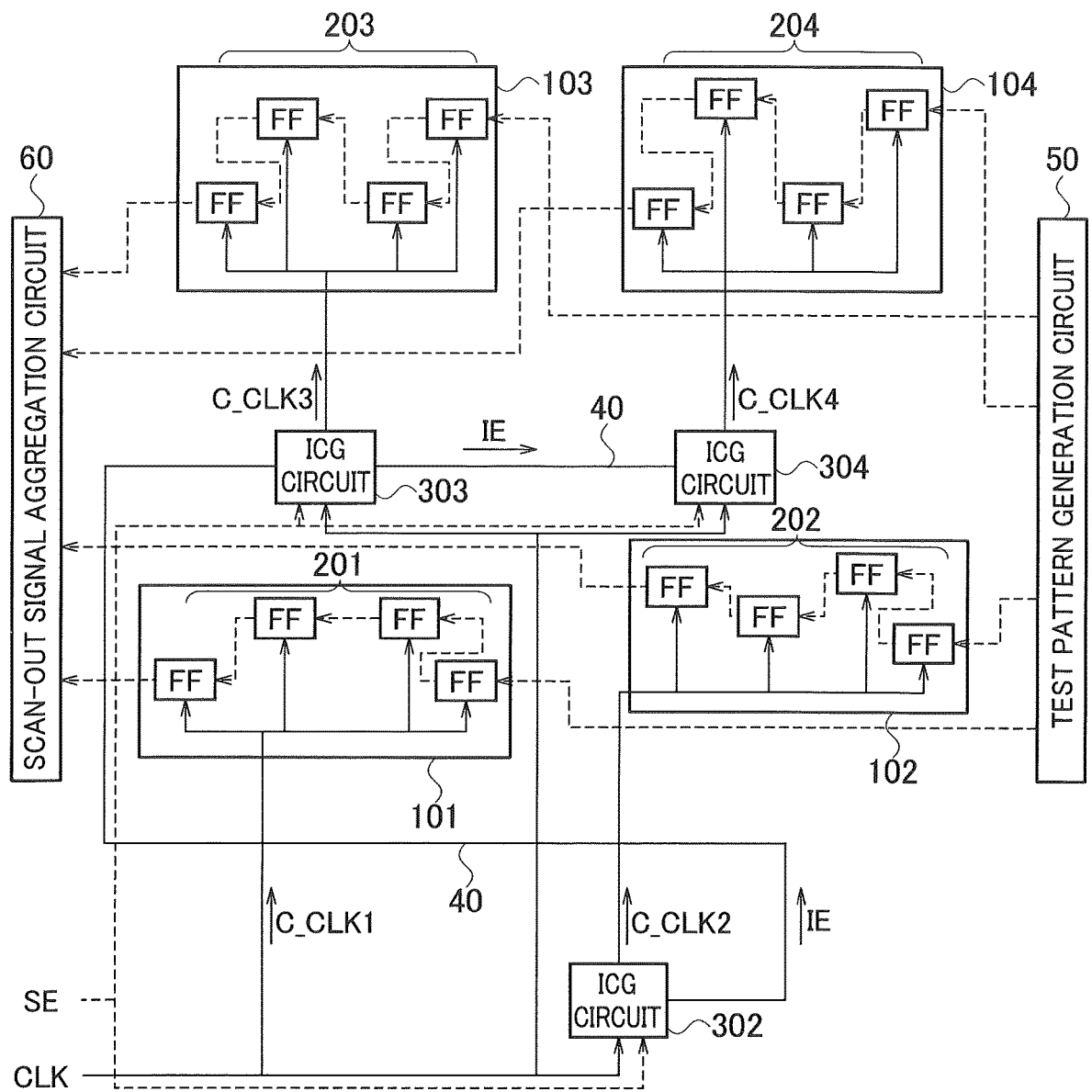
FIG. 13 is a circuit diagram illustrating a configuration of a semiconductor integrated circuit according to a second modified example of the first embodiment.

In some cases, the semiconductor integrated circuit includes a circuit block 10 to which the supply of the system clock signal CLK is not stopped by the clock gating technology, and which always operates. The ICG circuit 30 is not connected to such a circuit block 10 as described above, which is always supplied with the system clock signal CLK. FIG. 13 illustrates an example where the ICG circuit 30 is not connected to the circuit block 101. The ICG chain is composed of the ICG circuits 302 to 304. The circuit block 10 to which the ICG circuit 30 is not connected is supplied with the system clock signal CLK as the circuit clock signal C_CLK.

In the semiconductor integrated circuit illustrated in FIG. 13, in the circuit blocks 102 to 104 supplied with the system clock signal CLK from the ICG circuits 302 to 304, respectively, the FFs included in the scan chains 20 operate at pieces of timing which are different from one another. Hence, also in the semiconductor integrated circuit illustrated in FIG. 13, the instantaneous power consumption in the scan test is suppressed from increasing.

Second Embodiment

Figure 14:
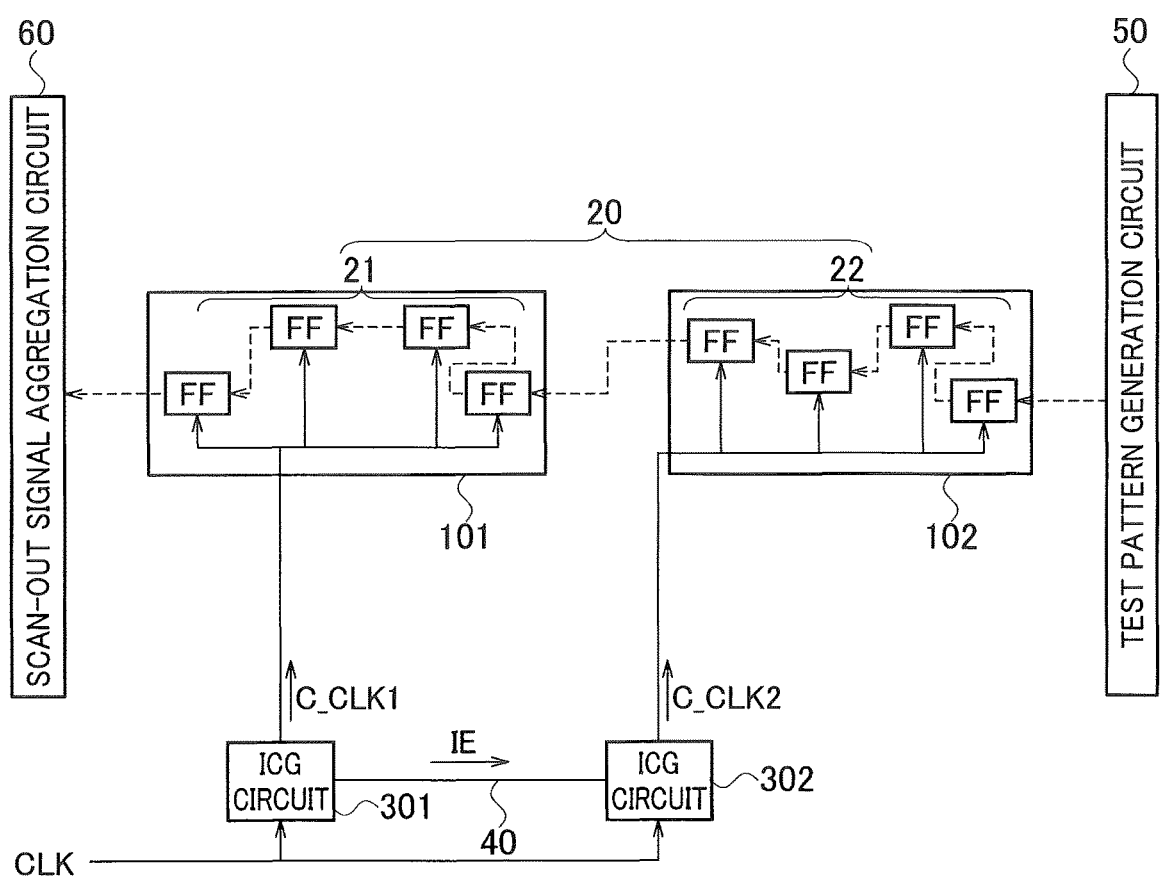
FIG. 14 is a circuit diagram illustrating a configuration of a semiconductor integrated circuit according to a second embodiment.

In a semiconductor integrated circuit according to a second embodiment, as illustrated in FIG. 14, one scan chain is divided into a plurality of parts (hereinafter, referred to as "partial scan chains"). FIG. 14 illustrates an example of dividing the scan chain 20 into two partial scan chains 21 and 22. Then, the respective partial scan chains are supplied with the circuit clock signals C_CLK from the different ICG circuits 30 at pieces of timing which are different from each other. The partial scan chain 21 is supplied with the circuit clock signal C_CLK1 from the ICG circuit 301, and the partial scan chain 22 is supplied with the circuit clock signal C_CLK2 from the ICG circuit 302. The semiconductor integrated circuit according to the second embodiment is different from the semiconductor integrated circuit illustrated in FIG. 1 in that the scan chain 20 has a configuration in which a plurality of the partial scan chains supplied with the circuit clock signals C_CLK individually from the different ICG circuits 30 are connected in series to each other.

For example, the scan chain 20 is composed of the plurality of partial scan chains when the number of sequential circuits included in one scan chain 20 is large, when a disposition interval of the sequential circuits is wide, and so on. Sequential circuits included in the same partial scan chain have the same timing when the circuit clock signals C_CLK are input thereto.

In FIG. 14, only one scan chain 20 is illustrated. However, as a matter of course, each of the plurality of scan chains may be divided into a plurality of partial scan chains. Moreover, though FIG. 14 illustrates an example where the scan chain 20 is divided into two partial scan chains, the number of partial scan chains which configure one scan chain 20 is arbitrary.

Herein, such a partial scan chain connected to the test pattern generation circuit 50 so as to be closest thereto will be referred to as "head-of-line scan chain". Moreover, such a partial scan chain connected to the scan-out signal aggregation circuit 60 so as to be closest thereto will be referred to as "end-of-line scan chain". That is, in the scan test, the sequential circuit included in the head-of-line scan chain performs the scan shift operation first, and the sequential circuit included in the end-of-line scan chain performs the scan shift operation last. In the example illustrated in FIG. 14, the partial scan chain 22 is the head-of-line scan chain, and the partial scan chain 21 is the end-of-line scan chain.

When the scan chain 20 is composed of the plurality of partial scan chains, it is preferable that the ICG enable propagation signal IE propagate from the end-of-line scan chain sequentially toward the head-of-line scan chain. That is, the ICG circuits 30 input the circuit clock signals C_CLK preferentially to the partial scan chain, in which the data of the FFs are rewritten later by the scan shift operation of the scan chain 20 in the scan test, prior to the partial scan chain, in which the data of the FFs are rewritten previously thereby.

Thus, the ICG enable propagation signal IE is input to the end-of-line scan chain most early, and the ICG enable propagation signal IE is input to the head-of-line scan chain at the very end. As a result, before the data of the FFs are rewritten in the scan test, the data of the FFs included in the end-of-line scan chain can be output.

In the example illustrated in FIG. 14, the ICG enable propagation signal IF is first input to the partial scan chain 21. Thereafter, the ICG enable propagation signal IE is input to the partial scan chain 22.

Other Embodiments

In the above, the description is given of the method of shifting the pieces of time of propagating the circuit clock signals C_CLK between the scan chains 20 by using the ICG circuits 30 for executing the clock gating technology. That is, the description is given of the example of the semiconductor integrated circuit in which whether or not the system clock signal CLK is propagated is set for each of the circuit blocks 10 by the clock gating technology. However, the circuit blocks 10 do not have to be units for which whether or not to supply the clock signals is discriminated by the clock gating technology.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a plurality of scan chains, each of which includes a serial connection of a plurality of sequential circuits, and performs a shift register operation; and
   an integrated clock gating (ICG) chain including a plurality of ICG circuits, each of which individually supplies a corresponding one of the scan chains with a circuit clock signal to operate the sequential circuits,
   wherein the ICG chain is coupled by a signal line,
   wherein an ICG enable propagation signal that propagates through the signal line is sequentially input to the ICG circuits, and
   wherein, in response to the input of the ICG enable propagation signal, each of the ICG circuits supplies the corresponding one of the scan chains with the circuit clock signal.

2. The semiconductor integrated circuit according to claim 1, wherein the ICG circuits output the circuit clock signals in an order of receiving the ICG enable propagation signal.

3. The semiconductor integrated circuit according to claim 1, wherein on-periods of the circuit clock signals are shorter in the ICG circuits to which the ICG enable propagation signal is input later among the plurality of ICG circuits included in the ICG chain.

4. The semiconductor integrated circuit according to claim 1, wherein a timing when a latter-stage ICG circuit, among two of the ICG circuits included in the ICG chain, outputs the circuit clock signal in response to the ICG enable propagation signal output from a previous-stage ICG circuit, among the two ICG circuits, is set to occur after a predetermined time elapses after the previous-stage ICG circuit outputs the circuit clock signal.

5. The semiconductor integrated circuit according to claim 4, wherein each of the ICG circuits includes:
   a first combinational circuit configured to output a logical sum of a clock gate control signal and a scan shift enable signal;
   an ICG sequential circuit configured to capture an output of the first combinational circuit at an off-state time of the system clock signal;
   a second combinational circuit configured to, when a stored value of the ICG sequential circuit is an enable signal, output, as the circuit clock signal, a logical product of the ICG enable propagation signal output by the previous-stage ICG circuit and the system clock signal; and
   a third combinational circuit configured to, when the scan shift enable signal is a disable signal, output an enable signal as the ICG enable propagation signal to a next-stage ICG circuit in the ICG chain, and when the scan shift enable signal is an enable signal, output the circuit clock signal as the ICG enable propagation signal to the next-stage ICG circuit in the ICG chain, and
   wherein, in a scan test, an enable signal is stored in the ICG sequential circuit in a state in which the scan shift enable signal is the enable signal, and the ICG circuit outputs a logical product of the system clock signal and the ICG enable propagation signal as the circuit clock signal and the ICG enable propagation signal.

6. The semiconductor integrated circuit according to claim 5,
   wherein, in an operation including a normal operation other than the scan test, the ICG sequential circuit stores the clock gate control signal in a state in which the scan shift enable signal is a disable signal and the ICG enable propagation signal is an enable signal, and
   wherein each of the ICG circuits outputs the system clock signal as the circuit clock signal when a stored value of the ICG sequential circuit is an enable signal, and outputs the off-state value as the circuit clock signal when the stored value of the ICG sequential circuit is a disable signal.

7. The semiconductor integrated circuit according to claim 1, wherein, due to a wiring delay of the ICG enable propagation signal, the wiring delay occurring in the signal line, the ICG circuits output the circuit clock signals at respective timings that are different among the scan chains.

8. The semiconductor integrated circuit according to claim 1, wherein each of the ICG circuits is composed of one cell.

9. The semiconductor integrated circuit according to claim 1,
   wherein each of the scan chains has a configuration in which a plurality of partial scan chains are connected in series to one another, and
   wherein the ICG circuits supply the respective partial scan chains with the circuit clock signals at respective timings that are different from one another.

10. The semiconductor integrated circuit according to claim 9, wherein the ICG circuits input the circuit clock signals preferentially to a first partial scan chain, of the plurality of partial chains, to which data of the sequential circuits are rewritten later in a scan test of the scan chain, prior to a second partial scan chain, of the plurality of partial chains, to which the data of the sequential circuits are rewritten previously in the scan test.

11. The semiconductor integrated circuit according to claim 1, further comprising a signal delay circuit that connects to at least any of terminals of the ICG circuits, to which the ICG enable propagation signal is input, and terminals of the ICG circuits, from which the ICG enable propagation signal is output.

12. The semiconductor integrated circuit according to claim 1, further comprising a signal delay circuit disposed in a middle of the signal line.

13. A method for controlling a semiconductor integrated circuit including a plurality of scan chains, each of which includes a serial connection of a plurality of sequential circuits, the method comprising:
   supplying the scan chains with circuit clock signals to operate the sequential circuits at respective timings that are different among the scan chains; and causing the scan chains to perform shift register operations in an order in which the scan chains are supplied with the circuit clock signals, wherein an integrated clock gating (ICG) chain is configured by coupling, via a signal line, a plurality of ICG circuits, each of which individually supplies a corresponding one of the scan chains with the circuit clock signal, an ICG enable propagation signal is propagated through the signal line and is sequentially input to the ICG circuits, and in each of the ICG circuits, in response to the input of the ICG enable propagation signal, the corresponding one of the scan chains is supplied with the circuit clock signal.

14. The method for controlling a semiconductor integrated circuit according to claim 13, wherein a timing when a latter-stage ICG circuit, among two of the ICG circuits included in the ICG chain, outputs the circuit clock signal in response to the ICG enable propagation signal output by a previous-stage ICG circuit, among the two ICG circuits, is set to occur after a predetermined time elapses after the previous-stage ICG circuit outputs the circuit clock signal.

15. The method for controlling a semiconductor integrated circuit according to claim 13, wherein, due to a wiring delay of the ICG enable propagation signal, the wiring delay occurring in the signal line, the circuit clock signals are output at the respective timings that are different among the scan chains.

16. The method for controlling a semiconductor integrated circuit according to claim 13, wherein, in one of the scan chains having a configuration in which a plurality of partial scan chains are connected in series to one another, the respective partial scan chains which configure one of the scan chains are supplied with the circuit clock signals at timings that are different from one another.

17. The method for controlling a semiconductor integrated circuit according to claim 16, wherein the circuit clock signals are input preferentially to a first partial scan chain, of the plurality of partial chains, to which data of the sequential circuits are rewritten later in a scan test of the scan chain, prior to a second partial scan chain, of the plurality of partial chains, to which the data of the sequential circuits are rewritten previously in the scan test.

18. The method for controlling a semiconductor integrated circuit according to claim 13, wherein a propagation time of the ICG enable propagation signal between the ICG circuits is lengthened by connecting a signal delay circuit to at least any of terminals of the ICG circuits, to which the ICG enable propagation signal is input, and terminals of the ICG circuits, from which the ICG enable propagation signal is output.

19. The method for controlling a semiconductor integrated circuit according to claim 13, wherein a propagation time of the ICG enable propagation signal between the ICG circuits is lengthened by disposing a signal delay circuit in a middle of the signal line.

* * * * *